United States Patent
Bhattacharya et al.

(10) Patent No.: US 7,098,694 B2
(45) Date of Patent: Aug. 29, 2006

(54) OVERVOLTAGE TOLERANT INPUT BUFFER

(75) Inventors: Dipankar Bhattacharya, Macungie, PA (US); John C. Kriz, Palmerton, PA (US); Bernard L. Morris, Emmanus, PA (US)

(73) Assignee: Agere Systems Inc., Allentown, PA (US)

( * ) Notice: Subject to any disclaimer, the term of this patent is extended or adjusted under 35 U.S.C. 154(b) by 59 days.

(21) Appl. No.: 10/988,103

(22) Filed: Nov. 12, 2004

(65) Prior Publication Data

US 2006/0103427 A1 May 18, 2006

(51) Int. Cl.
*H03K 19/175* (2006.01)
(52) U.S. Cl. .......................................... 326/81; 326/68
(58) Field of Classification Search ............ 326/80–81, 326/68
See application file for complete search history.

(56) References Cited

U.S. PATENT DOCUMENTS

| 5,894,230 | A | * | 4/1999 | Voldman | 326/86 |
| 6,031,393 | A | * | 2/2000 | Wayner | 326/81 |

* cited by examiner

*Primary Examiner*—James H. Cho

(57) ABSTRACT

When a P-channel pass gate transistor is added in parallel to an N-channel pass gate, the resulting circuit improves overvoltage tolerance of an input buffer. A simple bias circuit including two small transistors controls a gate of this P-channel pass gate transistor in such a way that it is turned OFF when an overvoltage is applied, but turned ON when a normal voltage is applied. Another embodiment has two N-channel devices (M12, M13) coupled in series with each other and one of the N-channel devices (M13) being configured in a "turned off" position, by coupling the source and gate terminals to a ground voltage (VSS) and providing the supply voltage (VDD) at the gate terminal of another N-channel device (M12), whereby the device M12 protects the device M13 from overvoltage.

19 Claims, 2 Drawing Sheets ical Field

The present invention relates to a CMOS input buffer protection circuit and, more particularly, to a CMOS input buffer protection circuit formed in low voltage CMOS technology (e.g., 3.3 V) that is tolerant to high input voltages (e.g., 5 V).

BACKGROUND

As a result of the many technologies and processes available to manufacture integrated circuits, a variety of circuits capable of operating in a variety of conditions, such as supply voltages, input/output voltages etc., became possible and with the adoption of several integrated circuit voltage standards, incompatibility became an issue. For example, circuits that operate at the earlier 5 V power supply standard may be incompatible with those operating under the newer standard of 3.3 V. Overvoltage is the condition where a voltage greater than which a technology was designed to support, for example, when a higher 5 V signal is applied to a circuit designed with lower 3.3 V. The problem of overvoltage is described in U.S. Pat. No. 6,064,231 to Kothandaraman et al., which is incorporated by reference in its entirety as if fully set forth herein. Numerous solutions have been proposed to solve the overvoltage problem but a need to improve the art remains.

SUMMARY

We have discovered that when a P-channel pass gate transistor is added in parallel to an N-channel pass gate, the resulting circuit improves overvoltage tolerance of an input buffer. In this configuration, signal to the input buffer would be rail-to-rail, ensuring that the P-channel pass gate in a first stage is fully turned OFF in a high state. A simple bias circuit including two small transistors controls a gate of this P-channel pass gate transistor in such a way that it is turned OFF when an overvoltage is applied, but turned ON when a normal voltage is applied.

BRIEF DESCRIPTION OF THE DRAWINGS

These and other objects, features and advantages of the present invention are more readily understood from the following detailed description in conjunction with the accompanying drawings, where like numbers represent like parts and wherein.

DETAILED DESCRIPTION

In the description below, with reference to the drawings, MX represents a transistor where X is a number, and "ON" and "OFF" denote two states of a transistor. Drain voltage ($V_{DD}$) represents supply voltage, and source voltage ($V_{SS}$) represents the ground. Threshold voltages of transistors are represented as Vtn for N-channel transistor and Vtp for a P-channel transistor. Note that the instant discussion uses transistors fabricated using the CMOS technology, but the invention applies to other technologies as well.

Figure 1:
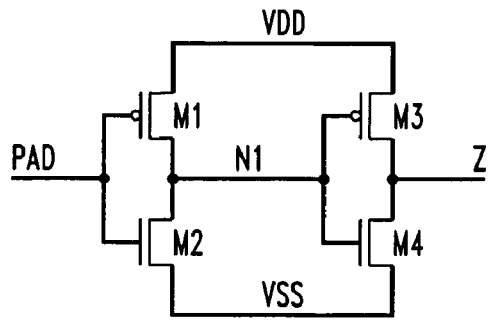
FIG. 1 shows a non-overvoltage tolerant input buffer.

FIG. 1 shows a circuit without overvoltage tolerance. A typical CMOS buffer has two inverters—one comprising transistors M1 and M2, and another comprising transistors M3 and M4—connected in series as shown. Note that M1 and M3 are P-channel transistors whereas M2 and M4 are N-channel transistors. PAD denotes an input to buffer. When PAD is high, node N1, the output of the first inverter and the input of the second inverter, is low and output Z of the buffer is high. When overvoltage is applied at input PAD of the buffer, overvoltage stresses gate oxide of transistor M2, thereby degrading the buffer's reliability.

Figure 2:
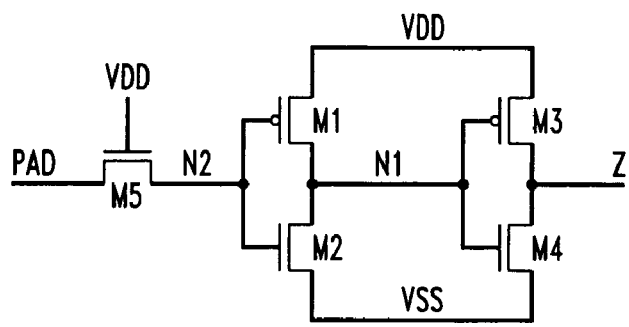
FIG. 2 shows an overvoltage tolerant input buffer with an N-channel transistor added as a pass gate between input PAD and buffer.

FIG. 2 shows an overvoltage tolerant buffer, where an N-channel transistor M5 is added as a pass gate between input PAD and buffer. This transistor M5, whose gate is connected to power supply $V_{DD}$, acts as a source-follower voltage clamp, and prevents voltage at node N2 from exceeding $V_{DD}$–Vtn, where Vtn is the threshold voltage of an N-channel transistor, the typical value of which is 0.6V. For instance, if 5V is applied to PAD, and $V_{DD}$ is 3.3V, then node N1 will have a voltage 3.3V-Vtn, or about 2.7V. This circuit works reliably because the placement of the transistor M5 ensures that no single transistor in the circuit has more than 3.3V across its gate or source-to-drain terminals.

But this circuit poses a problem. In a "high" state, i.e., when PAD is 3.3V, node N2 is still clamped at $V_{DD}$–Vtn. Thus, P-channel transistor M1 will have a gate bias of $V_{DD}$–Vtn. If Vtp (that is, threshold voltage of a P-channel transistor) is less than Vtn, which is possible because of process variations, transistor M1 will not be fully turned OFF, and DC power will flow from $V_{DD}$ to $V_{SS}$ through transistors M1 and M2, thereby consuming direct current (DC) power in a "high" state. Thus, undesired power consumption occurs because a P-channel in a first stage of buffer is not fully turned OFF.

Figure 3:
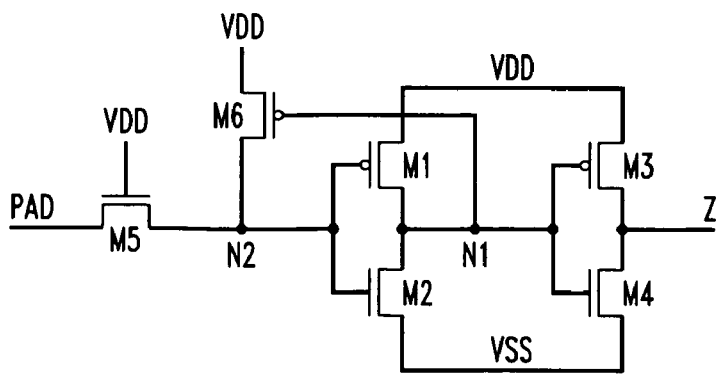
FIG. 3 shows a P-channel feedback transistor added to an N-channel pass gate transistor of FIG. 2.

FIG. 3 shows a solution to this problem where a P-channel feedback transistor M6 is added to N-channel pass gate transistor M5 of FIG. 2. By coupling gate of transistor M6 to output of inverter formed by transistors M1 and M2, feedback effect is achieved. Transistor M6 ensures that a first stage P-channel transistor is completely turned OFF. This works as follows.

Feedback transistor M6 acts to pull node N2 all the way up to $V_{DD}$ when input PAD is "high." Note that M6 may be a small, weak transistor. In a "high" state, node N1 is "low," which turns ON transistor M6 and pulls node N2 up to $V_{DD}$. In a "low" state, input PAD is "low," node N2 is "low," and node N1 is "high." A drawback of this configuration is that during state transitions feedback transistor M6 causes a leakage DC current from input PAD-via transistors M5 and M6—to power supply $V_{DD}$. This DC leakage current is typically several tens of microamperes, which is more than permitted leakage in some specifications. Additionally, transistor M6 requires a large gate length to operate properly, which can take up a large amount of area.

Figure 4:
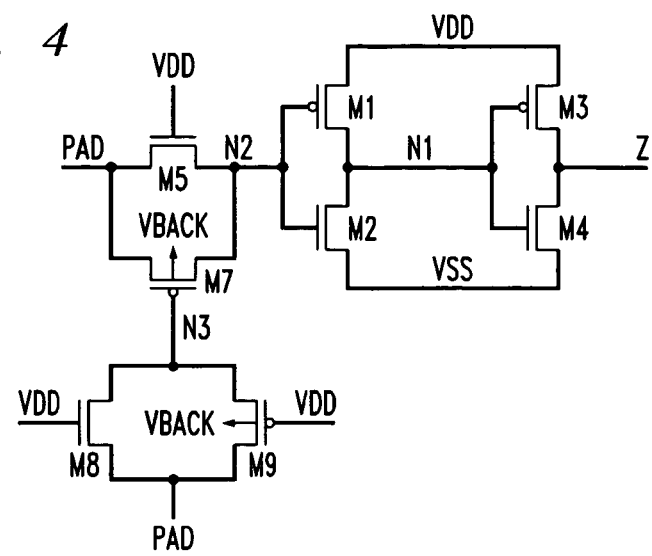
FIG. 4 shows an embodiment in which a P-channel pass gate is added in parallel to an N-channel pass gate.

FIG. 4 shows a circuit that allows node N2 to go all the way up to $V_{DD}$. Three transistors M7, M8 and M9 are added to the circuit of FIG. 2. M7 is a P-channel pass gate transistor, M8 is an N-channel transistor and M9 is a P-channel transistor. M7 is placed in parallel with N-channel pass gate M5. When M7 is ON, it permits the voltage at PAD to go all the way up to $V_{DD}$. Transistors M8 and M9 are connected in parallel as pass gates from PAD to node N3, which is gate of transistor M7, thereby providing a bias voltage at gate of transistor M7. Gates of both M8 and M9 are connected to $V_{DD}$. In normal operation, when PAD voltage does not exceed $V_{DD}$, transistor M9 is always OFF. When PAD voltage is "high," that is, it goes to $V_{DD}$, transistor M8 acts as a source follower and sets node N3 equal to $V_{DD}$–Vtn. This turns transistor M7 ON, albeit rather weakly, which in turn permits N2 to go all the way up to $V_{DD}$, thereby completely turning OFF transistor M1.

During an overvoltage event, for instance when 5V is applied to PAD and $V_{DD}$=3.3V, transistor M9 will turn ON. This allows the voltage on PAD to pass through to node N3. This voltage turns OFF transistor M7, and the circuit performs identically to the circuit of FIG. 2.

Note that P-channel transistors shown in FIGS. 1–3 have their back gates tied to a common node, $V_{DD}$. But if the node to which gates of P-channel devices are connected to a node such as PAD at which voltage can exceed $V_{DD}$, as is possible in an overvoltage condition, a parasitic diode inherent in the transistor structure turns ON. This means that devices M7 and M9 in FIG. 4 must have their back gates connected to some other voltage, which is typically called the "vback" voltage.

Figure 5:
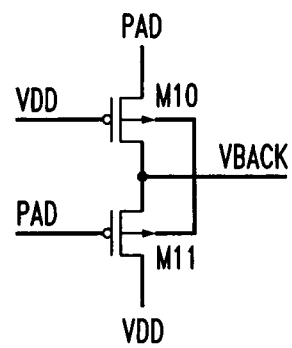
FIG. 5 shows a simple circuit generating "vback" voltage.

FIG. 5 shows a "vback" voltage generating circuit, where two P-channel transistors M10 and M11 are connected in series between PAD and $V_{DD}$. Their common node, which is also connected to their back gates, is "vback." Their gates are cross-coupled. When PAD voltage is less than $V_{DD}$, transistor M11 is ON and transistor M10 is OFF. This connects vback to $V_{DD}$. When PAD voltage is greater than $V_{DD}$, such as when PAD=5V and $V_{DD}$=3.3V, M1 is OFF and M10 is ON. In this case, vback is connected to PAD. Therefore vback is always equal to the greater of $V_{DD}$ or PAD voltage. This circuit may be used to bias back-gates of P-channel transistors in an output stage of overvoltage tolerant buffer of FIG. 4.

Figure 6:
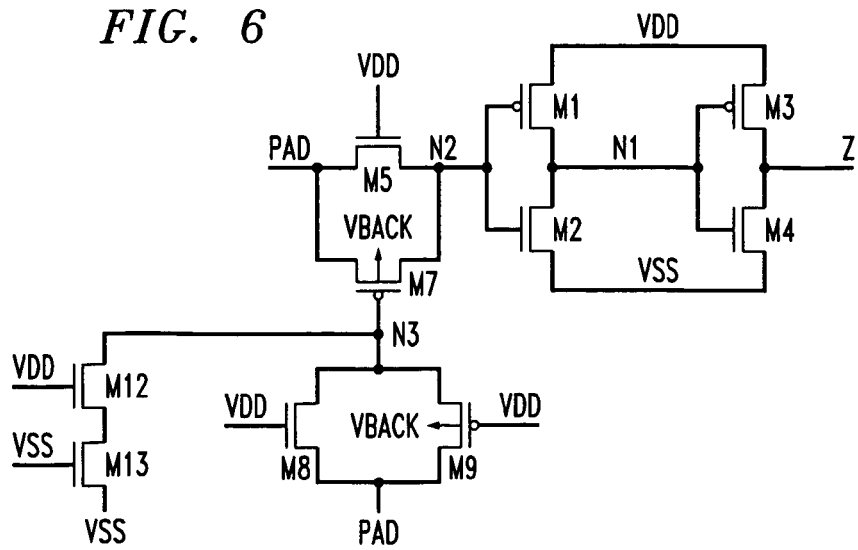
FIG. 6 shows another embodiment of a circuit in which a leakage path is provided to a pass gate.

FIG. 6 shows another overvoltage protection buffer circuit. Note that FIG. 4 is an independent solution to the overvoltage problem. FIG. 6 has two N-channel devices M12 and M13 coupled in series with each other. N-channel device M12 has a gate connected to power supply voltage $V_{DD}$, its drain to node N3, and its source to the drain of M13. N-channel device M13 is "turned off", i.e., its input is at or near ground $V_{SS}$.

M12 protects M13 from overvoltage as follows. As seen above, in connection with FIG. 4, node N3 will go to $V_{DD}$–Vtn when voltage at PAD exceeds $V_{DD}$. If M13 were directly connected to N3, voltage across its gate would be too "high" to tolerate. The purpose of the "turned-off" N-channel device M13 is to act as a small leakage path from N3 to ground. Because all MOS devices leak to some extent—i.e., even when they are turned "off"—M13 provides a very high resistance path from N3 to ground. This non-zero resistance helps maintain N3 at a voltage of $V_{DD}$–Vtn, since small current through M8 helps to set its gate-to-source voltage at Vtn. Other leakage paths from N3 to ground may also help maintain this voltage $V_{DD}$–Vtn at N3. Adding M12 and M13 is a way to ensure that N3 is maintained at desired voltage level $V_{DD}$–Vtn.

The foregoing describes an overvoltage tolerant buffer, which may be used in integrated circuits in general, and CMOS circuits in particular. Persons of ordinary skill in the art may make variations and modifications to the structure and operation of the disclosed apparatus without departing from the scope or spirit of the description herein or without undue experimentation. For example, the states described as OFF and ON or "high" and "low" could be logical states. Alternatively, OFF means that the circuit is turned off in the ordinary sense of the word, that is, no electric conduction takes place, and ON may mean an opposite condition to OFF. Similarly, in an alternative embodiment, "high" may mean that a higher voltage, for example, 5V, and "low" may mean that a lower voltage, e.g., the ground, or some other power supply voltage such as 3.3V is applied at a designated point. Likewise, devices M5, M8 and M9 have their gates connected to the power supply voltage $V_{DD}$. In alternative embodiments, these devices may be connected to the power supply $V_{DD}$ via a resistor, which makes the circuit more robust, that is, tolerant to damage caused by electrostatic discharge (ESD). All such and similar modifications, departures and variations fall within the scope of the appended claims.

What is claimed is:

1. An electronic circuit comprising:
   a buffer;
   a first N-channel device (M5);
   a first P-channel device (M7);
   a second N-channel device (M8);
   a second P-channel device (M9);
   the first N-channel device (M5), the first P-channel device (M7), the second N-channel device (M8) and the second P-channel device (M9) configured as pass gates;
   said first N-channel device (M5) and the first P-channel device (M7) coupled between an input point (PAD) and an input (N2) of the buffer; and
   the second N-channel device (M8) and the second P-channel device (M9) arranged in parallel, coupled from the input point (PAD) to a gate of the first P-channel device (M7).

2. The electronic circuit of claim 1 further comprising:
   a third N-channel device (M12); and
   a fourth N-channel device (M13);
   wherein the third N-channel device (M12) and the fourth N-channel device (M13) are coupled in series with each other, drain of the third N-channel device (M12) is coupled to the gate of the first P-channel device (M7), and the fourth N-channel device (M13) is configured to be in a "turned off" position, whereby the third N-channel device (M12) protects the fourth N-channel device (M13) from overvoltage.

3. The electronic circuit of claim 2, wherein source and drain terminals of the fourth N-channel device are coupled together and to a ground voltage $V_{SS}$.

4. The electronic circuit of claim 2, wherein source terminal of the third N-channel device (M12) and drain terminal of the fourth N-channel device (M13) being coupled together.

5. The electronic circuit of claim 2, wherein gate terminal of the third N-channel device (M12) is coupled to the supply voltage $V_{DD}$.

6. The electronic circuit of claim 1 wherein the buffer comprises:
   a first inverter (M1, M2) and a second inverter (M3, M4) connected in series.

7. The electronic circuit of claim 1 wherein the buffer is a CMOS input buffer.

8. The electronic circuit of claim 1 wherein the circuit is configured to protect the buffer from overvoltage.

9. The electronic circuit of claim 1 where the first N-channel device (M5) has its gate connected to power supply voltage $V_{DD}$.

10. The electronic circuit of claim 1 where the second N-channel device (M8) has its gate connected to power supply voltage $V_{DD}$.

11. The electronic circuit of claim 1 where the second P-channel device (M9) has its gate connected to power supply voltage $V_{DD}$.

12. An integrated circuit including a CMOS input buffer protection circuit comprising:
  a CMOS input buffer circuit (M1,M2,M3,M4);
  a first N-channel device (M5);
  a first P-channel device (M7);
  a second N-channel device (M8);
  a second P-channel device (M9);
  the first N-channel device (M5), the first P-channel device (M7), the second N-channel device (M8) and the second P-channel device (M9) configured as pass gates;
  said first N-channel device (M5) and the first P-channel device (M7) coupled between an input point (PAD) and an input (N2) of the buffer; and
  the second N-channel device (M8) and the second P-channel device (M9) arranged in parallel, coupled from the input point (PAD) to a drain of the first P-channel device (M7),
  whereby the CMOS input buffer circuit is protected from overvoltage.

13. The integrated circuit of claim 12 further comprising:
  a third N-channel device (M12); and
  a fourth N-channel device (M13);
  wherein the third N-channel device (M12) and the fourth N-channel device (M13) are coupled in series with each other, drain of the third N-channel device (M12) is coupled to the gate of the first P-channel device (M7), and the fourth N-channel device (M13) is configured to be in a "turned off" position, whereby the third N-channel device (M12) protects the fourth N-channel device (M13) from overvoltage.

14. The integrated circuit of claim 13, wherein source and drain terminals of the fourth N-channel device are coupled together and to a ground voltage $V_{SS}$.

15. The integrated circuit of claim 13, wherein source terminal of the third N-channel device (M12) and drain terminal of the fourth N-channel device (M13) being coupled together.

16. The integrated circuit of claim 13, wherein gate terminal of the third N-channel device (M12) is coupled to the supply voltage $V_{DD}$.

17. The integrated circuit of claim 12 where the first N-channel device (M5) has its gate connected to power supply voltage $V_{DD}$.

18. The integrated circuit of claim 12 where the second N-channel device (M8) has its gate connected to power supply voltage $V_{DD}$.

19. The integrated circuit of claim 12 where the second P-channel device (M9) has its gate connected to power supply voltage $V_{DD}$.

* * * * *